United States Patent
Suchel et al.

(10) Patent No.: US 12,121,969 B2
(45) Date of Patent: Oct. 22, 2024

(54) METHOD FOR MANUFACTURING A COMPOSITE MATERIAL VANE WITH AN ATTACHED METAL LEADING EDGE

(71) Applicant: SAFRAN AIRCRAFT ENGINES, Paris (FR)

(72) Inventors: Christian Suchel, Moissy-Cramayel (FR); Sébastien Gouet, Moissy-Cramayel (FR); Sophie Martine Jobez, Moissy-Cramayel (FR); Christine Macheret, Moissy-Cramayel (FR)

(73) Assignee: SAFRAN AIRCRAFT ENGINES, Paris (FR)

( * ) Notice: Subject to any disclaimer, the term of this patent is extended or adjusted under 35 U.S.C. 154(b) by 284 days.

(21) Appl. No.: 17/770,238

(22) PCT Filed: Oct. 13, 2020

(86) PCT No.: PCT/FR2020/051806
§ 371 (c)(1),
(2) Date: Apr. 19, 2022

(87) PCT Pub. No.: WO2021/079042
PCT Pub. Date: Apr. 29, 2021

(65) Prior Publication Data
US 2022/0362856 A1    Nov. 17, 2022

(30) Foreign Application Priority Data
Oct. 23, 2019    (FR) ...................................... 1911847

(51) Int. Cl.
*B22F 10/80*    (2021.01)
*B29C 65/00*    (2006.01)
(Continued)

(52) U.S. Cl.
CPC .............. *B22F 10/80* (2021.01); *B29C 65/48* (2013.01); *B29C 66/721* (2013.01);
(Continued)

(58) Field of Classification Search
CPC .......... F01D 5/147; F01D 5/282; F01D 5/288; B29C 65/48; B29C 66/721; B29C 66/742;
(Continued)

(56) References Cited

U.S. PATENT DOCUMENTS 9,199,345 B2    12/2015    Flesch et al.
10,138,738 B2   11/2018    Obuchi et al.
(Continued)

FOREIGN PATENT DOCUMENTS

CN    102231170 A    11/2011
CN    105598450 A    5/2016
(Continued)

OTHER PUBLICATIONS

International Search Report as issued in International Patent Application No. PCT/FR2020/051806, dated Dec. 22, 2020.
(Continued)

*Primary Examiner* — S. Behrooz Ghorishi
(74) *Attorney, Agent, or Firm* — Pillsbury Winthrop Shaw Pittman LLP

(57) ABSTRACT

A method for manufacturing a blade in composite material with added metal leading edge for gas turbine aeroengine, the method including producing a batch of plurality of blade bodies in composite material; creating a digital model of a blade body from a blade in the batch of plurality of blade bodies; creating a digital model of a theoretical final blade including a leading edge; generating a digital model of a leading edge from the digital model of a blade body and final blade model; manufacturing at least one leading edge via additive manufacturing from the generated leading edge
(Continued)

digital model; bonding each manufactured leading edge onto a blade body from the batch of plurality of blade bodies.

8 Claims, 4 Drawing Sheets

(51) Int. Cl.
    *B29C 65/48*     (2006.01)
    *B29L 31/08*     (2006.01)
    *B33Y 50/00*     (2015.01)
    *F01D 5/14*     (2006.01)
    *F01D 5/28*     (2006.01)

(52) U.S. Cl.
    CPC ............ *B29C 66/742* (2013.01); *B33Y 50/00* (2014.12); *B29L 2031/082* (2013.01); *F01D 5/147* (2013.01); *F01D 5/282* (2013.01); *F05D 2230/23* (2013.01); *F05D 2240/303* (2013.01); *F05D 2300/603* (2013.01)

(58) Field of Classification Search
    CPC ......... B33Y 50/00; B33Y 80/00; B33Y 10/00; B29L 2031/082; B22F 10/80; B22F 10/00; B22F 5/04; F05D 2230/23; F05D 2240/303; F05D 2300/603; F05D 2220/36; F05D 2230/22; F04D 29/324; G06F 30/20; G06F 30/15
See application file for complete search history.

(56) References Cited

U.S. PATENT DOCUMENTS

| | | |
|---|---|---|
| 2005/0084377 A1 | 4/2005 | Dambrine et al. |
| 2007/0092379 A1 | 4/2007 | Coupe et al. |
| 2013/0195673 A1 | 8/2013 | Godfrey et al. |
| 2015/0151485 A1 | 6/2015 | Godon et al. |
| 2016/0076387 A1* | 3/2016 | Chauvin ............... F01D 25/285 |
| | | 156/423 |
| 2016/0167269 A1 | 6/2016 | Pautard |
| 2016/0208624 A1* | 7/2016 | Smith .................... F01D 5/147 |
| 2017/0081752 A1 | 3/2017 | Hanley |
| 2018/0274375 A1 | 9/2018 | Notarianni et al. |
| 2019/0344506 A1* | 11/2019 | Franken ................... G07D 7/20 |

FOREIGN PATENT DOCUMENTS

| | | |
|---|---|---|
| CN | 108237202 A | 7/2018 |
| CN | 208513592 U | 2/2019 |
| EP | 3 050 651 A1 | 8/2016 |

OTHER PUBLICATIONS

First Office Action as issued in Chinese Patent Application No. 202080074657.6, dated Apr. 28, 2023.

* cited by examiner

[Fig. 1]
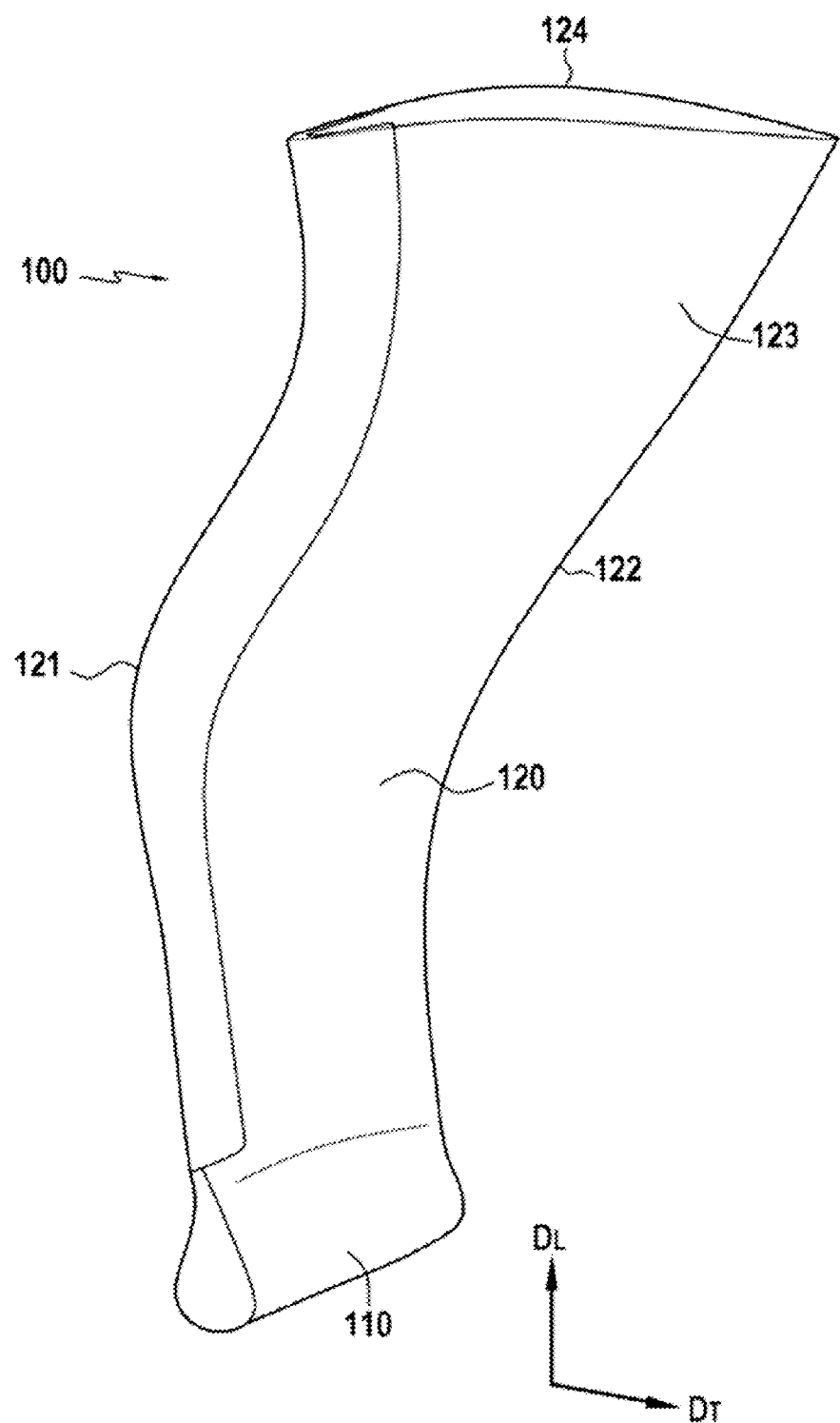

[Fig. 2]
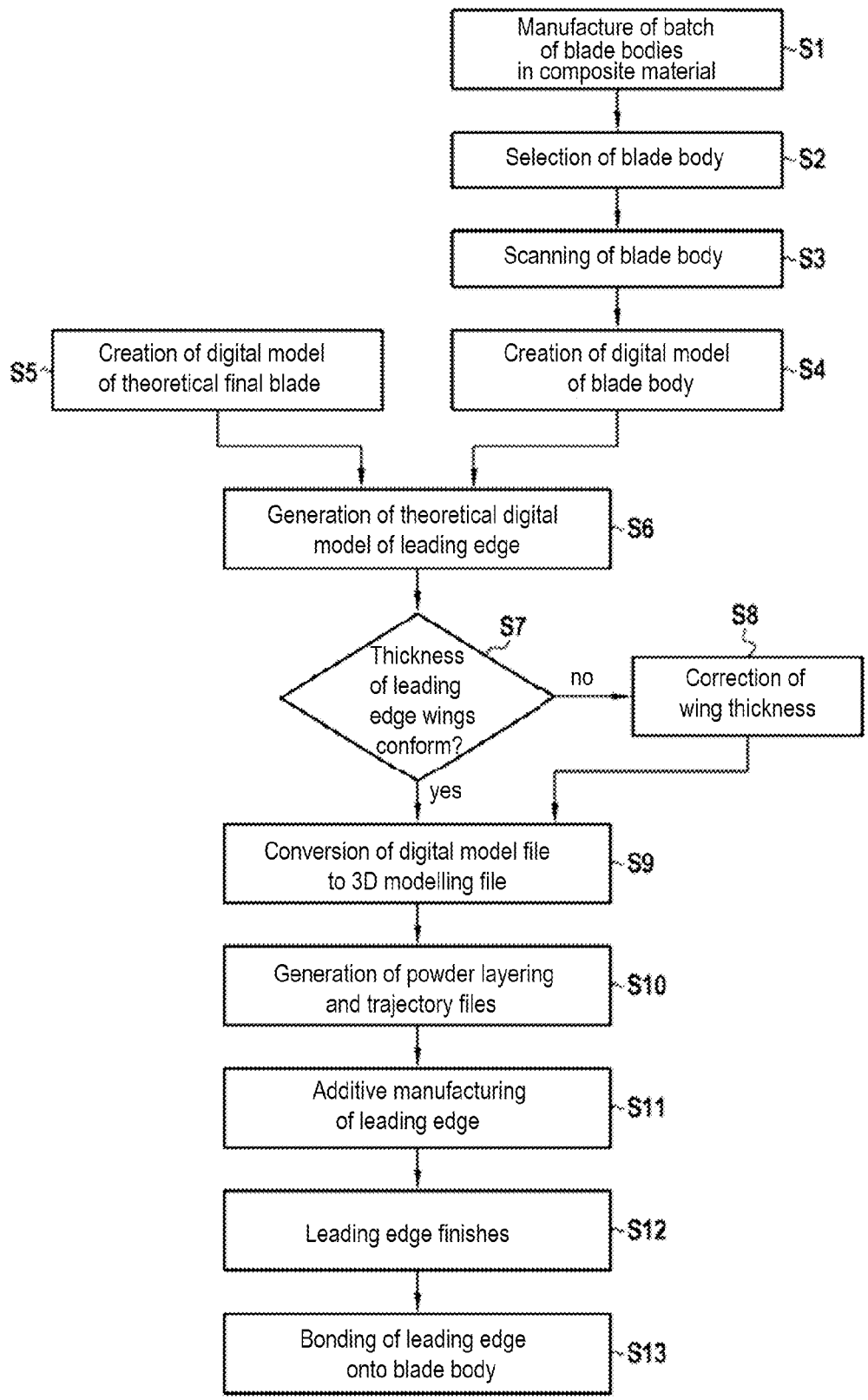

[Fig. 3]
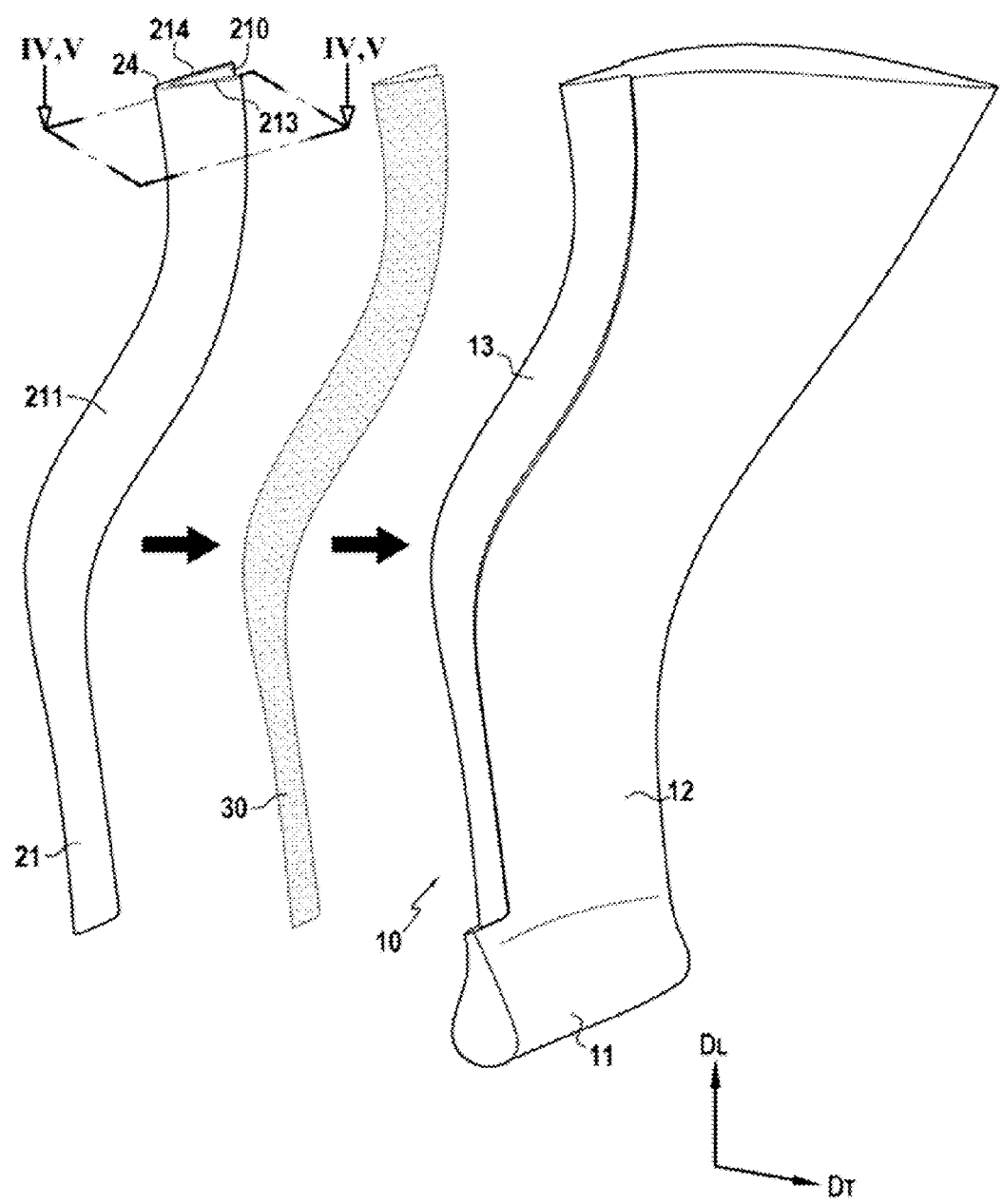

[Fig. 4]
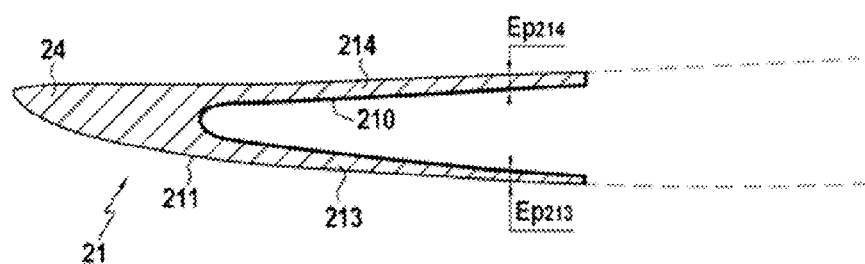
[Fig. 5]
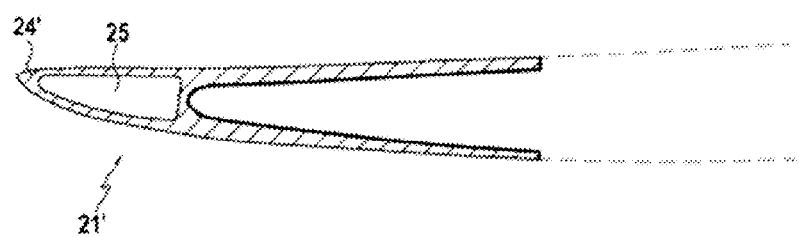

METHOD FOR MANUFACTURING A COMPOSITE MATERIAL VANE WITH AN ATTACHED METAL LEADING EDGE

CROSS-REFERENCE TO RELATED APPLICATIONS

This application is the U.S. National Stage of PCT/FR2020/051806, filed Oct. 13, 2020, which in turn claims priority to French patent application number 19 11847 filed Oct. 23, 2019. The content of these applications are incorporated herein by reference in their entireties.

TECHNICAL FIELD

The present invention relates to the general field of the manufacture of a blade in composite material comprising a metal leading edge, for gas turbine aeroengine.

PRIOR ART

The presence of a metal leading edge on a blade in composite material of a gas turbine aeroengine provides protection for the composite blade assembly against abrasion/erosion and against foreign object impacts. This is particularly the case for mobile fan blades of an aircraft turbine engine which are exposed to bird strikes, hail, ice etc. but also for the stationary vanes of a gas turbine diffuser or straightener.

There are numerous methods for manufacturing blades in composite material for gas turbine engines. Mention can be made for example of the hand lay-up/draping method, the method of injection-moulding a fibrous preform, tailored fibre placement, thermo-compression, etc. These methods are chiefly based on the use of a thermosetting (TS) or thermoplastic (TP) resin.

Once the blade in composite material is obtained, a protective metal leading edge must be assembled onto the foremost edge thereof. For this purpose, a metal strip manufactured by mechanical methods such as stamping, forming or electro-forming for example, is bonded onto the foremost edge of the blade in composite material. This operation can be performed in a mould to ensure bonding of the metal strip. Examples of blades in composite material provided with a metal leading edge are described in particular in documents US 2007/092379 and US 2016/0167269.

Added leading edges are generally manufactured in titanium for reasons of weight savings. The manufacture of a metal leading edge with current manufacturing techniques is demanding since the leading edge must pay precise heed to the complex geometry of the foremost edge of the blade (twist, change in radius, etc.) and exhibit very high mechanical strength.

Additionally, bonding of the metal leading edge onto the foremost edge of the blade in composite material is an awkward operation, in particular with regard to control over reproducibility of the positioning and distribution of the bonding material between the blade and metal strip. If the bonding layer is not uniform between the blade and metal strip, the quality of bonding is degraded leading to reduced mechanical strength of the metal strip and resulting risk of loss thereof in the event of foreign object impact or exposure to delaminating forces.

SUMMARY OF THE INVENTION

The chief object of the present invention is therefore to propose a method for manufacturing a blade in composite material provided with a metal leading edge which does not have the aforementioned disadvantages.

In the invention, this object is reached by means of a method for manufacturing a blade in composite material with added metal leading edge, for gas turbine aeroengine, the method comprising:
- producing a batch of plurality of blade bodies in composite material;
- creating a digital model of a blade body from a blade in the batch of plurality of blade bodies;
- creating a digital model of a theoretical final blade comprising a leading edge;
- generating a digital model of a leading edge from the digital model of a blade body and final blade model;
- manufacturing at least one leading edge via additive manufacturing from the generated leading edge digital model;
- bonding each manufactured leading edge onto a blade body from the batch of plurality of blade bodies.

With the method of the invention, it is therefore possible to obtain a tailored leading edge which adapts perfectly to the geometry of a plurality of blades from one same batch, to ensure a continuous homogeneous thickness of adhesive over the entire contact interface between the leading edge and the blade.

According to a first characteristic of the method of the invention, the creation of a digital model of a theoretical final blade comprising a leading edge comprises calculating the geometry of the outer wall of the leading edge from the digital model of a final blade, and calculating the geometry of the inner wall of the leading edge from the digital model of a blade body.

According to a second characteristic of the method of the invention, after generation of the leading edge digital model, it further comprises verification of the conformity of the thickness of the wings of the leading edge in said leading edge digital model, and correction of the leading edge digital model in the event of non-conformity of wing thickness.

According to a third characteristic of the method of the invention, at the time of additive manufacturing of each leading edge, reference points are marked on the leading edge to facilitate positioning of the leading edge on the blade body when bonding said leading edge.

According to a fourth characteristic of the method of the invention, at the time of additive manufacturing of each leading edge, at least one identification mark is made on the leading edge. For example, it is possible to integrate a serial number for each leading edge.

According to a fifth characteristic of the method of the invention, at the time of additive manufacturing of each leading edge, a pattern is locally embossed on the inner wall of the leading edge. Said pattern particularly allows facilitated control over the thickness of the adhesive material over the entire bonding interface.

According to a sixth characteristic of the method of the invention, at the time of additive manufacturing of each leading edge, the inner wall of the leading edge is texturized. This texturing allows increased adhering of the leading edge onto the blade body.

According to a seventh characteristic of the method of the invention, if the leading edge(s) manufactured by additive manufacturing are produced with a metal material having greater density than titanium then, at the time of additive manufacturing of each leading edge, at least one recess is formed at the nose portion of the leading edge. It is therefore possible to obtain leading edges in a material having high density whilst controlling the overall weight of the leading edge.

BRIEF DESCRIPTION OF THE DRAWINGS

FIG. 1 gives a perspective, schematic view of a blade in composite material provided with an added metal leading edge according to one embodiment of the invention.

FIG. 2 is a flow diagram of the steps to manufacture the blade in FIG. 1 according to one embodiment of the invention.

FIG. 3 gives a perspective, exploded, schematic view showing the assembling of a metal leading edge onto a blade body in composite material.

FIG. 4 is a schematic, cross-sectional view of the leading edge in FIG. 3.

FIG. 5 is a schematic, cross-sectional view of a variant of embodiment of the leading edge in FIG. 3.

DESCRIPTION OF EMBODIMENTS

The invention applies to the manufacturing of blades in composite material having a metal leading edge, for gas turbine aeroengine.

Nonlimiting examples of the latter are in particular fan blades, Outlet Guide Vanes (OGVs), Inlet Guide Vanes (IGVs) and Variable Stator Vanes (VSVs), etc.

A method conforming to the invention is described relating to the manufacture of a fan blade such as blade 100 illustrated in FIG. 1 which, in the longitudinal direction $D_L$, comprises a blade root 110 and airfoil body 120 extending in transverse direction $D_T$ between a leading edge 121 and trailing edge 122. The airfoil body 120 also comprises a lower surface 123 and upper surface 124. The leading edge 121 is composed of a metal strip bonded onto the airfoil body 120. With the exception of the leading edge 121, the blade 100 is in composite material.

As illustrated in FIG. 2, the method of manufacturing the blade starts with producing a batch of plurality of blade bodies in composite material obtained from a fibrous reinforcement densified with a matrix (step S1). By "blade body" it is meant herein a blade body entirely in composite material comprising most of the constituent parts of the final blade, namely the blade root and airfoil body such as described above, with the exception of the leading edge composed of a metal strip added onto the blade body as detailed below.

Blade bodies are manufactured from a fibrous preform able to be obtained in different manners known to skilled persons. Typically, the preform can be obtained directly by three-dimensional (3D) weaving of yarns (formed of carbon fibres for example) or by draping two-dimensional fibrous fabrics. The manufacture of a fan blade in composite material prepared from a fibrous reinforcement obtained by three-dimensional weaving and densified with a matrix is particularly described in document US 2005/084377. In the example described herein, the fan blade preform is obtained by 3D weaving of yarns in carbon fibres.

In known manner, each blade preform is impregnated with a liquid composition containing a precursor of the matrix material. The precursor is usually in the form of a polymer such as a resin optionally diluted in a solvent. The preform is placed in a mould able to be hermetically closed and with a housing having the shape of the moulded blade body which may in particular be of twisted shape corresponding to the final shape of the airfoil body with aerodynamic profile. The mould is closed and the liquid matrix precursor e.g. an epoxy resin is injected into the entire housing to impregnate all the fibrous part of the preform. Impregnation of the blade fibrous preform can be obtained in particular using Resin Transfer Moulding (RTM), a process that is well known.

Conversion of the precursor to a matrix e.g. by curing is performed by heat treatment generally by heating the mould after removing any solvent, and crosslinking of the polymer, the preform remaining in the mould having a shape corresponding to that of the aerodynamic structure. The matrix can particularly be obtained from epoxy resins such as the high-performance epoxy resin sold under the reference PR 520 by CYTEC, or from liquid precursors of carbon or ceramic matrixes.

For the forming of a carbon or ceramic matrix, heat treatment entails pyrolyzing the organic precursor to convert the organic matrix to a carbon or ceramic matrix depending on the precursor used and conditions of pyrolysis. For example, liquid carbon precursors can be resins with relatively high coke content such as phenolic resins, while liquid ceramic precursors, SiC in particular, can be resins of polycarbosilane (PCS) polytitanocarbosilane (PTCS) or polysilazane (PSZ) type. Several consecutive cycles, starting from impregnation and up to heat treatment, can be carried out to reach the desired degree of densification.

After formation of the matrix, the part is released from the mould. The part is finally trimmed to remove excess resin and the chamfers are machined. No other machining is necessary since, being moulded, the part meets required dimensions. A blade body 10 is obtained which, as illustrated in FIG. 3, comprises a blade root part 11 corresponding to the blade root 110 of the above-described blade 100, and an airfoil body part 12 corresponding to the airfoil body 120 of the blade 100. The airfoil body part 12 comprises a foremost edge 13 intended to receive a metal strip to form the leading edge of the final blade.

Several blade bodies are thus manufactured to form a batch of blade bodies. By "batch of blade bodies", it is meant herein a set of blade bodies each having dimensional dispersion lower than a determined limit. For example, a batch of blade bodies is considered homogeneous if the dispersion of thickness cross-section by cross-section in the region intended to receive the leading edge does not exceed 10%. By "cross-section" it is meant here a fictitious cross-section of the airfoil in a plane perpendicular to its height, the cross-sections being determined in the technical definition of the part.

A blade body is selected from among the blade bodies in one same batch (step S2).

The airfoil body part 12 is scanned in three dimensions (step S3) to create a digital model of the blade body (step S4) particularly comprising a model of the foremost edge portion 13 onto which the metal strip is intended to be bonded to form the leading edge of the final blade. A digital model of the theoretical final blade is created in parallel (step S5). The digital model of the theoretical final blade corresponds to the blade body in composite material equipped with its leading edge in metal material. The digital models of the blade body and theoretical final blade are then used to generate a theoretical digital model of a leading edge (step S6). More specifically, the theoretical digital model of the theoretical final blade is used to calculate the geometry of the outer wall of the leading edge in the theoretical digital model of a leading edge. The digital model of the blade body is used to calculate the geometry of the inner wall 210 of the leading edge 21 (FIGS. 3 and 4) intended to be bonded onto the foremost edge portion 13, by integrating in this calculation the definition of a determined uniform thickness of adhesive or bonding material between the inner wall of the leading edge and the surface of the foremost edge.

Once the theoretical digital model of the leading edge has been generated, the conformity of the thickness of the wings of the leading edge in said leading edge digital model is verified (step S7). At this verification, the thickness of the wings defined in the digital model is compared with predefined minimum and maximum thicknesses. If, after verification, the thickness of the wings of the digital model does not conform, the model is corrected to define wing thicknesses conforming to predefined criteria (step S8). After optional correction of wing thickness, the theoretical digital model of the leading edge is converted to a 3D modelling file able to be used for additive manufacturing (step S9), e.g. a file in well-known STL format ("STereo-Lithography").

Among known methods of additive manufacturing, the following methods can be used in particular to form the leading edge:
- metal additive manufacturing in layers whereby particles are bonded via fusion using a laser source, also called powder bed fusion, Selective Laser Melting (SLM) or Laser Beam Melting (LBM);
- Laser Metal Deposition (LMD);
- metal additive manufacturing in layers whereby particles are bonded via fusion using an electron beam: Electron Beam Melting.

The 3D modelling file e.g. in STL format is used to generate the layers of powder to be fused, and to generate the trajectories of the melting tool to manufacture the leading edge (laser, electron beam) (step S10).

A near-finished leading edge having the shape and dimensions defined in the theoretical digital model of the leading edge is then produced by additive manufacturing (step S11).

After additive manufacturing, a leading edge is obtained which already has the desired shape (outer geometry) and final dimensions (net-shape part). This obviates the need for machining and adapted mechanical polishing operations of the outer and inner walls of the leading edge, these usually being carried out when leading edges are obtained by casting for example and are complex to perform on account of the flexibility of the part. These finishing operations are replaced here by a surface treatment operation (step S12), for example an electrochemical polishing sequence which does not impact the dimensions of the leading edge.

This gives a finished leading edge or metal strip 21 ready to be assembled onto the blade body 10 as illustrated in FIG. 3. The leading edge 21 comprises an inner wall 210 intended to be bonded onto the foremost edge portion 13 of the blade body 10, and an outer wall 211 defining the leading edge profile of the final blade. The leading edge 21 also comprises a nose portion 24 from which there extend two wings 213 and 214 each of thickness $E_{p213}$ and $E_{p214}$ (FIG. 4) conforming to the predefined criteria as explained in the foregoing.

At the last step in the manufacturing method, the metal leading edge 21 is bonded onto the blade body in composite material 10 (step S13). More specifically, and as illustrated in FIG. 3, the leading edge 21 is docked onto the foremost edge portion 13 of the airfoil body part 12 of the blade body, interposing a layer of adhesive or adhesive material 30 between the inner wall 210 of the leading edge and the foremost edge portion 13 of the blade body 10. The layer of adhesive between the leading edge and the foremost edge portion of the blade body can be applied in different manners as illustrated in FIG. 3. In particular it may correspond to an adhesive material sandwiched between the inner wall of the leading edge and the foremost edge portion of the blade body; the whole, once assembled, being placed in a bonding mould which is heated to activate (cure) the adhesive property of the material. A layer of adhesive can also be directly deposited on the inner wall 210 of the leading edge 21 and/or on the foremost edge portion 13 of the blade body, assembling being performed in a bonding mould able to apply pressure on the elements to be assembled and optionally to carry out bonding heat treatment.

A method for bonding a leading edge onto a blade body in composite material is described in particular in document US 2015/151485.

Since the inner wall 210 of the leading edge 21 has been manufactured following geometry fully corresponding to the geometry of the foremost edge portion 13 of the blade body 10 taking into account the presence of a determined thickness of adhesive between these two parts, homogeneous distribution is ensured of the adhesive over the entire interface between the leading edge and the foremost edge portion. Control over the thickness of the adhesive is thereby ensured over the entire bonding interface which provides against the onset of local areas with weak bonding and/or of local stresses.

Several leading edges can be produced, repeating steps S11 and S12, and assembled onto blade bodies of one same batch following step S13.

In addition to direct manufacturing in final net-shape, additive manufacturing can also advantageously be used to provide leading edges with functional or visual elements. In the present invention, additive manufacturing can be used in particular also to obtain:
- reference points on the leading edge to facilitate positioning of the leading edge on the blade body when bonding the leading edge;
- one or more identification marks on the leading edge e.g. a serial number;
- raised or recessed relief patterns locally formed on the inner wall of the leading edge to facilitate control over the thickness of adhesive over all the bonding interface;
- texturing on the inner wall of the leading edge to promote adhesion.

The leading edges of the invention can be made in different metal materials compatible with additive manufacturing processes, such as: titanium or alloys thereof, aluminium or alloys thereof, stainless steel, Inconel.

When the leading edge is formed from a metal material having greater density than titanium, additive manufacturing can be used to form at least one recess at the nose portion of the leading edge, such as recess 25 shown in FIG. 5 in nose portion 24' of leading edge 21', corresponding to one variant of embodiment of the leading edge 21 already described.

The invention claimed is:

1. A method for manufacturing a blade in composite material with added metal leading edge for gas turbine aeroengine, the method comprising:
producing a batch of plurality of blade bodies in composite material;
creating a digital model of a blade body from a blade in the batch of plurality of blade bodies;
calculating a geometry of an inner wall of the leading edge intended to be bonded onto a foremost edge portion using the digital model of the blade body, the calculating including using a definition of a determined uniform thickness of adhesive or bonding material between the inner wall of the leading edge and a surface of the foremost edge;

creating a digital model of a theoretical final blade comprising a leading edge;

generating a digital model of the leading edge from the digital model of the blade body and the theoretical final blade model;

manufacturing at least one leading edge via additive manufacturing from the generated leading edge digital model, and bonding each manufactured leading edge onto each blade body from the batch of plurality of blade bodies.

2. The method according to claim 1, wherein the creation of the digital model of the theoretical final blade comprising the leading edge comprises calculating a geometry of the outer wall of the leading edge from the digital model of the theoretical final blade.

3. The method according to claim 1, after generation of the leading edge digital model, further comprising verification of a conformity of a thickness of wings of the leading edge in said leading edge digital model, and correction of the leading edge digital model in the event of non-conformity of wing thickness.

4. The method according to claim 1 wherein, at the time of additive manufacturing of each leading edge, reference points are marked on the leading edge to facilitate positioning of the leading edge on the blade body when bonding said leading edge.

5. The method according to claim 1 wherein, at the time of additive manufacturing of each leading edge, at least one identification mark is made on the leading edge.

6. The method according to claim 1 wherein, at the time of additive manufacturing of each leading edge, raised or recessed relief patterns are locally formed on the inner wall of the leading edge.

7. The method according to claim 1 wherein, at the time of additive manufacturing of each leading edge, the inner wall of the leading edge is texturized.

8. The method according to claim 1, wherein each leading edge manufactured by additive manufacturing is produced with a metal material having greater density than titanium, and wherein at the time of additive manufacturing of each leading edge, at least one recess is formed at a nose portion of the leading edge.

* * * * *